US009229640B2

(12) United States Patent
Sankar et al.

(10) Patent No.: US 9,229,640 B2
(45) Date of Patent: Jan. 5, 2016

(54) INEXPENSIVE SOLID-STATE STORAGE BY THROTTLING WRITE SPEED IN ACCORDANCE WITH EMPIRICALLY DERIVED WRITE POLICY TABLE

(71) Applicant: Microsoft Corporation, Redmond, WA (US)

(72) Inventors: Sriram Sankar, Redmond, WA (US); Badriddine Khessib, Redmond, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 102 days.

(21) Appl. No.: 14/082,080

(22) Filed: Nov. 15, 2013

(65) Prior Publication Data

US 2015/0143019 A1    May 21, 2015

(51) Int. Cl.
*G06F 12/00* (2006.01)
*G06F 3/06* (2006.01)
*G06F 12/02* (2006.01)
(Continued)

(52) U.S. Cl.
CPC ............ *G06F 3/0613* (2013.01); *G06F 3/0616* (2013.01); *G06F 3/0644* (2013.01); *G06F 3/0653* (2013.01); *G06F 3/0676* (2013.01); *G06F 3/0679* (2013.01); *G06F 11/008* (2013.01); *G06F 12/0246* (2013.01); *G06F 3/061* (2013.01); *G06F 13/1668* (2013.01);
(Continued)

(58) Field of Classification Search
CPC ............ G06F 2212/222; G06F 11/008; G06F 2212/7208; G06F 3/0616; G06F 13/1668; G06F 3/061; G06F 3/0613; G06F 3/0629; G06F 3/0632; G06F 3/0653; G06F 3/0676; G06F 3/0644; G06F 3/0679; G06F 12/0246; G11C 29/50; G11C 2211/5641
USPC ........................ 711/170, 4, 102, 103; 714/718
See application file for complete search history.

(56) References Cited

U.S. PATENT DOCUMENTS 7,409,492 B2    8/2008  Tanaka et al.
7,930,481 B1 *  4/2011  Nagler et al. ................. 711/118
(Continued)

OTHER PUBLICATIONS

"International Search Report and Written Opinion Issued in PCT Patent Application No. PCT/US2014/065105", Mailed Date: Feb. 4, 2015, 10 Pages.
(Continued)

*Primary Examiner* — Hong Kim
(74) *Attorney, Agent, or Firm* — Henry Gabryjelski; Kate Drakos; Micky Minhas

(57) ABSTRACT

Many of the benefits of solid-state-based storage devices can be obtained, while minimizing the costs associated therewith, by write-throttling solid-state storage media in accordance with empirically derived capabilities. Untested solid-state storage media can be obtained inexpensively due to the lack of waste that is otherwise been inherent in the testing and subsequent discarding of solid-state storage media whose capabilities do not meet stringent manufacturer standards. The untested solid-state storage media is initialized through a testing procedure that empirically identifies capabilities of individual solid-state blocks, or groupings of blocks, within such solid-state storage media. Such empirically obtained capability information is then utilized to throttle the speed at which data is written to the solid-state storage media. Additionally, it can enable binning of individual solid-state blocks, or individual groupings of blocks, into bins that can comprise different performance thresholds.

20 Claims, 4 Drawing Sheets

(51) Int. Cl.
  *G06F 11/00* (2006.01)
  *G06F 13/16* (2006.01)
  *G11C 29/50* (2006.01)

(52) U.S. Cl.
  CPC ........ *G11C 29/50* (2013.01); *G11C 2211/5641* (2013.01)

(56) References Cited

U.S. PATENT DOCUMENTS

| | | | |
|---|---|---|---|
| 7,975,095 B2 | 7/2011 | Hsieh et al. | |
| 8,028,121 B2 | 9/2011 | Jeong | |
| 8,230,184 B2 | 7/2012 | Danilak | |
| 8,285,918 B2 | 10/2012 | Maheshwari | |
| 8,332,696 B2 | 12/2012 | Zeng | |
| 8,341,501 B2 | 12/2012 | Franceschini et al. | |
| 2004/0148484 A1* | 7/2004 | Watanabe et al. | 711/170 |
| 2007/0050684 A1* | 3/2007 | Takaoka et al. | 714/47 |
| 2008/0082776 A1 | 4/2008 | Spielberg et al. | |
| 2008/0126682 A1 | 5/2008 | Zhao et al. | |
| 2012/0131381 A1 | 5/2012 | Eleftheriou et al. | |
| 2012/0210058 A1 | 8/2012 | Mittendorff et al. | |
| 2012/0278534 A1 | 11/2012 | Sun et al. | |
| 2013/0007380 A1 | 1/2013 | Seekins et al. | |
| 2013/0067168 A1* | 3/2013 | Havewala et al. | 711/118 |
| 2013/0086302 A1* | 4/2013 | Tressler et al. | 711/103 |
| 2013/0145075 A1 | 6/2013 | Huang et al. | |
| 2013/0282954 A1 | 10/2013 | Sankar et al. | |
| 2014/0019677 A1* | 1/2014 | Chang et al. | 711/105 |
| 2014/0244899 A1* | 8/2014 | Schmier et al. | 711/103 |

OTHER PUBLICATIONS

"Wear-Leveling Techniques in NAND Flash Devices", In Technical Note—TN-29-42, Oct. 11, 2010, 8 pages.

* cited by examiner

INEXPENSIVE SOLID-STATE STORAGE BY THROTTLING WRITE SPEED IN ACCORDANCE WITH EMPIRICALLY DERIVED WRITE POLICY TABLE

BACKGROUND

Modern storage media includes not only media that store data in a physically sequential manner, such as traditional magnetic and optical storage media, but also media that store data in a physically random manner, such as solid-state-based storage media. Such physically random media allow any one block of data to be accessed as efficiently as any other block of data. These, and other, physical differences between the various storage media commonly available today result in storage media that differ in capability, attributes and performance. For example, magnetic and optical media require a reading and writing apparatus that physically moves from the physical location of the device head to the physical location of a block. Consequently, the speed with which such storage media can read or write data is dependent upon the proximity of the locations of the data on the media, since the device head must physically transition from one location to the other. Conversely, solid-state storage media can read and write data through electrical signals without requiring any physically moving parts. As a result, the data stored on such media can be written, or read, with efficiency that is not dependent upon the particular location of the data on, for example, rotating media.

From the perspective of usage within data center environments, solid-state storage media are perceived as having specific performance advantages over magnetic storage media. For example, solid-state storage media are generally regarded as being more power efficient, more heat-tolerant, and less prone to physical disturbances and failures than magnetic storage media, since, as indicated previously, solid-state storage media can comprise no moving parts. Such advantages can be substantial in data center environments, where operating such data centers at higher temperatures can result in monetary savings resulting from less energy utilization by cooling apparatuses, and where the increased power efficiency of the solid-state storage media can result in further monetary savings from less energy utilization by the storage media themselves. Additionally, solid-state storage media are generally regarded as being able to both read and write data more quickly than magnetic storage media, which can provide benefits in data center environments, as well as other computing environments.

Unfortunately, solid-state storage media are often orders of magnitude more expensive, for a given amount of storage capacity, than magnetic storage media. Such expense derives in large part from inefficiencies in the packaging of solid-state storage media. In particular, solid-state storage media are comprised of individual, transistor-based blocks that store bits of data. Such blocks are manufactured on wafers, which are divided into die pieces that can be sliced out of the wafer. Each die can comprise thousands, or even millions, of such blocks, and one or more dies can form the basis of solid-state-based storage media. The individual solid-state blocks can have differing capabilities, with some blocks being capable of greater performance and/or endurance than other blocks. In building solid-state-based storage media from dies, the failure of die, including the failure to achieve certain performance or endurance thresholds, can result in the entire solid-state-based storage media to be considered unfit for resale. Such exacting standards can result in substantial waste, increasing the cost of solid-state storage media.

SUMMARY

In one embodiment, solid-state storage media can be untested and, as such, can be comprised of solid-state blocks that can have differing capabilities. Such untested solid-state storage media can be orders of magnitude less expensive than commonly available solid-state-based storage media, since such commonly available solid-state storage media can be priced to account for a large percentage of solid-state storage media that is manufactured but is not sold due to insufficient capabilities discovered after testing.

In another embodiment, an initial test can be performed on the solid-state storage media that is comprised of solid-state blocks that can have differing capabilities. Such an initial test can empirically identify the capabilities of each solid-state block, or individual groupings of blocks, and can provide such information to inform subsequent utilization of the solid-state storage media.

In a further embodiment, the speed at which data is written to the solid-state storage media can be throttled in accordance with empirically identified capabilities of the solid-state storage media. By throttling the speed at which data is written to the solid-state storage media, certain solid-state blocks may not be utilized to their full performance potential, but a greater quantity of solid-state blocks can be utilized, resulting in a greater storage capacity. Additionally, by throttling the speed at which data is written to the solid-state storage media, the endurance of the solid-state storage media can be increased.

In a still further embodiment, the throttling of the speed at which data is written to the solid-state storage media can have a lower bound equivalent to the speed at which data can be written to conventional magnetic storage media that could be utilized in analogous environments. The solid-state storage media can then have data written to it at least as fast as competing conventional magnetic storage media, and can be as inexpensive as competing conventional magnetic storage media due to the greater utilization inherent in such lower write speeds. However, the solid-state storage media can have data read from it substantially faster than competing conventional magnetic storage media, and can be more reliable, more power efficient, and more heat tolerant than competing conventional magnetic storage media.

In a yet further embodiment, the empirically identified capabilities of the solid-state storage media can enable binning of individual solid-state blocks, or individual groupings of blocks, into bins that can comprise different performance thresholds. The utilization of such bins of differing performance can be based on metadata identifying aspects of the data to be stored on such bins. Optionally, such bins can define differing logical storage volumes.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Additional features and advantages will be made apparent from the following detailed description that proceeds with reference to the accompanying drawings.

DESCRIPTION OF THE DRAWINGS

The following detailed description may be best understood when taken in conjunction with the accompanying drawings, of which.

DETAILED DESCRIPTION

Figure 1:
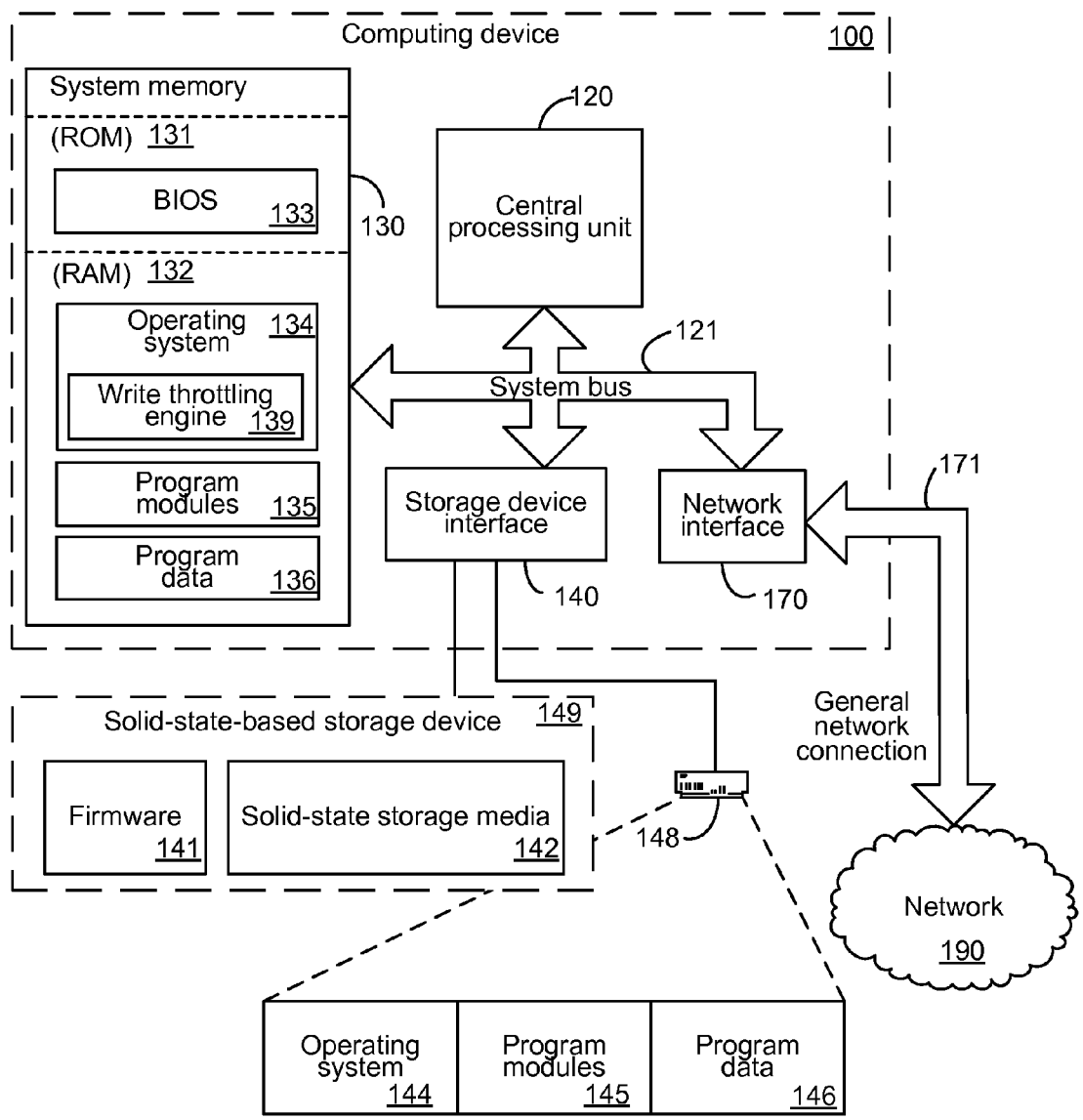
FIG. 1 is a block diagram of an exemplary computing device having coupled thereto an exemplary solid-state-based storage device.

The following description relates to obtaining many of the benefits of solid-state-based storage devices while minimizing the costs associated therewith by write-throttling solid-state storage media in accordance with empirically derived capabilities. Untested solid-state storage media can be obtained inexpensively due to the lack of waste that is otherwise inherent in the testing and subsequent discarding of solid-state storage media whose capabilities do not meet stringent manufacturer standards. The untested solid-state storage media can be initialized through a testing procedure that can empirically identify capabilities of individual solid-state blocks, or groupings of blocks, within such solid-state storage media. Such empirically obtained capability information can then be utilized to throttle the speed at which data is written to the solid-state storage media. By throttling the speed at which data is written to the solid-state storage media, a greater quantity of solid-state blocks can be utilized, resulting in a greater storage capacity at a reduced cost. Additionally, by throttling the speed at which data is written to the solid-state storage media, the endurance of the solid-state storage media can be increased. The write throttling can have a lower bound equivalent to the speed at which data can be written to conventional magnetic storage media that could be utilized in analogous environments. The solid-state storage media can then have data written to it at least as fast as competing conventional magnetic storage media, and can be as inexpensive as competing conventional magnetic storage media due to the greater utilization inherent in such lower write speeds. However, the solid-state storage media can have data read from it substantially faster than competing conventional magnetic storage media, and can be more reliable, more power efficient, and more heat tolerant than competing conventional magnetic storage media. The empirically identified capabilities of the solid-state storage media can enable binning of individual solid-state blocks, or individual groupings of blocks, into bins that can comprise different performance thresholds. The utilization of such bins of differing performance can be based on metadata identifying aspects of the data to be stored on such bins. Optionally, such bins can define differing logical storage volumes.

The techniques described herein focus on, but are not limited to, solid-state-based storage devices. To the contrary, the mechanisms described below are equally applicable to any type of storage media comprised of individual units that can have different capabilities, such that manufacturers of the storage media accept or discard large portions of the storage media due to reduced capabilities in only some of the individual units, thereby resulting in high cost to recover the manufacturing expense of the discarded storage media.

By way of background, the production of conventional solid-state-based storage devices also results in the production of solid-state materials that are deemed to have insufficient capabilities for subsequent resale. Consequently, the production costs of such materials that are deemed to be unsellable are incorporated into the sale price of materials whose capabilities are found to be sufficient for subsequent resale, thereby increasing the price of those materials. More specifically, and as will be known by those skilled in the art, solid-state storage media, such as for use in solid state-based storage devices, is typically produced on wafers of silicon or other like materials. Each wafer is typically sized to accommodate multiple "dies" of solid-state storage media. The dies are separated from the wafer by a process known as "dicing", and are then packaged for subsequent utilization in, for example, solid state-based storage devices. Before being utilized in such storage devices, each packaged die is tested to ensure that its capabilities meet predetermined thresholds.

The tested capabilities of solid-state storage media dies include the performance of the individual solid-state components or "blocks" that will store bits of digital data, the endurance of such solid-state blocks, and other capabilities, such as their voltage thresholds, their retention, and the like. For example, some solid-state blocks may be able to have data written to them more quickly than others of the solid-state blocks. Similarly, as another example, some solid-state blocks may be expected to be able to undergo more rewrite cycles than other solid-state blocks, and can thereby be considered to have greater endurance. Typically, solid-state storage media dies are designed to have a defined storage capacity, such as, for example, one gigabyte. To be sold as a one gigabyte solid-state storage chip, a packaged die must comprise a sufficient quantity of solid-state blocks to store one gigabyte worth of data, where each of those solid-state blocks has been confirmed to have at least a threshold level of performance, endurance, and other like tested capabilities. If there are not enough of the solid-state blocks of a packaged die that meet those threshold capability levels, for example if there are not enough of such solid-state blocks to store one gigabyte of data, then that packaged die cannot be sold as a one gigabyte solid-state storage chip and may simply be discarded. Such is the case even if that die did have solid state blocks, which met some lower threshold capability level, in sufficient quantity to store one gigabyte, or more, worth of data.

The cost of a solid-state storage chip, therefore, is based not only on the overhead and manufacturing costs associated with that specific chip, but also the costs associated with all of the chips whose dies were discarded because they lacked a sufficient quantity of solid-state blocks meeting threshold capability levels. More specifically, the pricing of solid-state storage media, such as the aforementioned dies that are packaged into solid-state storage chips, is established by first establishing threshold capability levels, subsequently identifying a quantity of solid state storage media meeting such threshold capability levels, and then finally setting the price of such solid-state storage media so that the sale, at such prices, of the quantity of solid-state storage media meeting such threshold capability levels is sufficient to cover the costs of manufacturing both the solid-state storage media that did meet the threshold capability levels and the solid-state storage media that was discarded for not meeting such threshold capability levels.

The mechanisms described herein enable the utilization of solid-state storage media without regard to threshold capability levels. Consequently, solid-state storage media purchased for utilization with the mechanisms described herein can be substantially reduced in price so that the pricing of such solid-state storage media can rival that of conventional magnetic-based storage media. More specifically, the price of solid-state storage media purchased for utilization with the mechanisms described herein no longer need cover the costs of manufacturing solid-state storage media that was discarded for not meeting threshold capability levels, since, as indicated, the mechanisms described herein enable solid-state storage media to be purchased without first determining whether such solid-state storage media needs any threshold capability levels at all. While the lack of threshold capability levels can result in the purchase of some solid-state storage media that can be unsuitable, the mechanisms described herein enable the utilization of a substantial percentage of such unthresholded solid-state storage media by utilizing any solid-state storage media whose performance is at least as good as comparable magnetic media-based storage devices. As a result, the mechanisms described herein, enable solid-state-based storage devices whose cost can be approximately equivalent to comparable magnetic media-based storage devices, whose performance can be at least as good as comparable magnetic media-based storage devices, if not greater, and whose power consumption, heat tolerance and reliability can be meaningfully greater than comparable magnetic media-based storage devices.

Although not required, the descriptions below will be in the general context of computer-executable instructions, such as program modules, being executed by one or more computing devices. More specifically, the descriptions will reference acts and symbolic representations of operations that are performed by one or more computing devices or peripherals, unless indicated otherwise. As such, it will be understood that such acts and operations, which are at times referred to as being computer-executed, include the manipulation by a processing unit of electrical signals representing data in a structured form. This manipulation transforms the data or maintains it at locations in memory, which reconfigures or otherwise alters the operation of the computing device or peripherals in a manner well understood by those skilled in the art. The data structures where data is maintained are physical locations that have particular properties defined by the format of the data.

Generally, program modules include routines, programs, objects, components, data structures, and the like that perform particular tasks or implement particular abstract data types. Moreover, those skilled in the art will appreciate that the computing devices need not be limited to conventional personal computers, and include other computing configurations, including hand-held devices, multi-processor systems, microprocessor based or programmable consumer electronics, network PCs, minicomputers, mainframe computers, and the like. Similarly, the computing devices need not be limited to a stand-alone computing device, as the mechanisms may also be practiced in distributed computing environments where tasks are performed by remote processing devices that are linked through a communications network. In a distributed computing environment, program modules may be located in both local and remote memory storage devices.

With reference to FIG. 1, an exemplary computing device 100 is illustrated, which can include, but is not limited to, one or more central processing units (CPUs) 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus or point-to-point architectures.

The computing device 100 also typically includes computer readable media, which can include any available media that can be accessed by computing device 100, either by obtaining data from, or providing data to, such computer readable media, and includes both volatile and nonvolatile media and removable and non-removable media. By way of example, and not limitation, computer readable media may comprise computer storage media and communication media. Computer storage media includes media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computing device 100. Computer storage media, however, does not include communication media. Communication media typically embodies computer readable instructions, data structures, program modules or other data in a modulated data signal such as a carrier wave or other transport mechanism and includes any information delivery media. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computing device 100, such as during start-up, is typically stored in ROM 131. RAM 132 typically contains data and/or program modules that are immediately accessible to and/or presently being operated on by processing unit 120. By way of example, and not limitation, FIG. 1 illustrates an operating system 134, other program modules 135, and program data 136. As will be described further below, the operating system 134 can include a write throttling engine 139 that can provide for the utilization of the unthresholded solid-state storage media referenced above.

The computing device 100 may also include other removable/non-removable, volatile/nonvolatile computer storage media. By way of example, FIG. 1 illustrates a solid-state-based storage device 149 and, optionally, a hard disk drive 148, both of which are communicationally coupled to the computing device 100 via a storage device interface 140 that is, in turn, connected to the system bus 121. The solid-state-based storage device 149 can comprise solid-state storage media 142, such as the unthresholded solid-state storage media referenced above. By way of example only, the solid-state storage media 142 can be based on single-level cell (SLC) or multi-level cell (MLC) based solid-state technology. Other removable/non-removable, volatile/nonvolatile solid-state storage media that can be used include, but are not limited to, FLASH memory cards, RAM disks and the like. Additionally, the solid-state-based storage device 149 can further comprise firmware 141 that can, either by itself, or in combination with the write throttling engine 139, provide for utilization of the solid-state storage media 142. As another option, the functionality of the firmware 141 can be wholly or partially incorporated into the write throttling engine 139, as will also be described further below.

The hard disk drive 148 can be a magnetic-based storage device or other sequential storage device, a solid-state-based storage device, including a conventional solid-state-based storage device, and other like storage devices. By way of example and not limitation, the hard disk drive 148 can be RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computing device 100. For purposes of illustration, the hard disk drive 148 can provide storage of computer readable instructions, data structures, program modules and other data for the computing device 100. In FIG. 1, for example, the hard disk drive 148 is illustrated as storing an operating system 144, other program modules 145, and program data 146. Note that these components can either be the same as or different from operating system 134, other program modules 135 and program data 136. Operating system 144, other program modules 145 and program data 146 are given different numbers here to illustrate that, at a minimum, they are different copies.

The computing device 100 may operate in a networked environment using logical connections to one or more remote computers. For simplicity of illustration, the computing device 100 is shown in FIG. 1 to be connected to a network 190 that is not limited to any particular network or networking protocols. The logical connection depicted in FIG. 1 is a general network connection 171 that can be a local area network (LAN), a wide area network (WAN) or other network. The computing device 100 is connected to the general network connection 171 through a network interface or adapter 170 that is, in turn, connected to the system bus 121. In a networked environment, program modules depicted relative to the computing device 100, or portions or peripherals thereof, may be stored in the memory of one or more other computing devices that are communicatively coupled to the computing device 100 through the general network connection 171. It will be appreciated that the network connections shown are exemplary and other means of establishing a communications link between computing devices may be used.

In one embodiment, the hard disk drive 148 can provide for the storage of computer executable instructions that, when executed by the central processing unit 120, enable the solid-state-based storage device 149 to be initialized in accordance with the mechanisms described in detail below. In an alternative embodiment, initialization of the solid-state-based storage device 149 can be performed by computer executable instructions resident on other storage media or otherwise accessible to the computing device 100 from other media. In such an alternative embodiment, the hard disk drive 148 can be optional and the operating system 144, program modules 145 and program data 146 illustrated as being stored thereupon can, instead, be stored on the solid-state-based storage device 149 once the solid-state-based storage device 149 is initialized for operation, in accordance with the mechanisms described in detail below.

Figure 2:
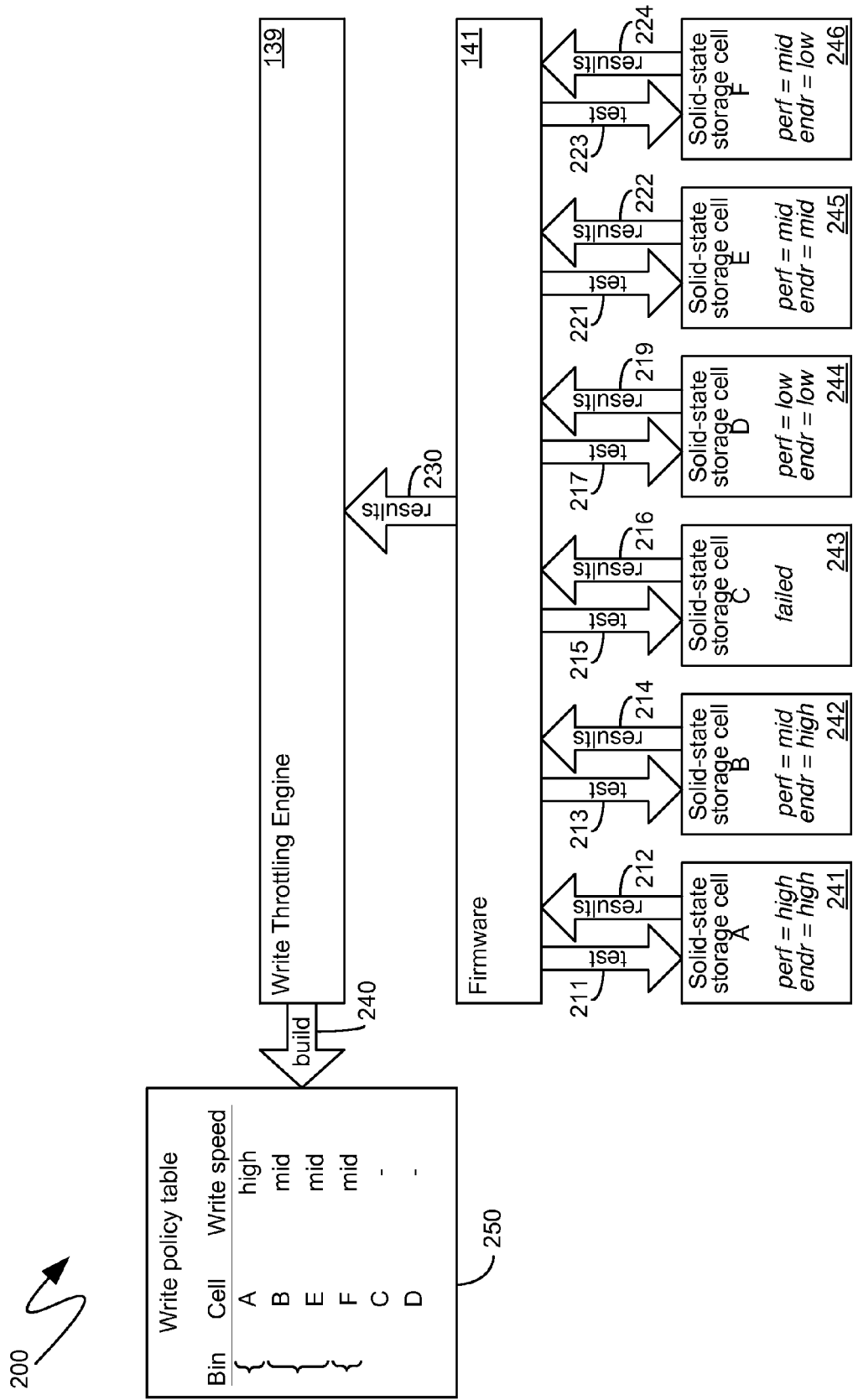
FIG. 2 is a layer block diagram of an exemplary initial testing of solid-state storage media.

Turning to FIG. 2, the system 200 shown therein illustrates a portion of an exemplary initialization of a solid-state-based storage device, such as the exemplary solid-state-based storage device 149 that was illustrated in FIG. 1. More specifically, and as indicated previously, in one embodiment, a solid-state-based storage device can be comprised of unthresholded solid-state storage media. As utilized herein, the term "unthresholded" means media that has not been previously tested and, as such, includes both media that would exceed defined threshold capability levels and media that would fail to achieve those same defined threshold capability levels. Consequently, in such an embodiment, initialization of a solid-state-based storage device comprising such unthresholded solid-state storage media can comprise the testing of such unthresholded solid-state storage media for purposes of identifying the capabilities of such unthresholded solid-state storage media and for purposes of defining portions of such unthresholded solid-state storage media based on such identified capabilities.

Thus, in one embodiment, as illustrated by the system 200 of FIG. 2, the solid-state storage media of a solid-state based storage device can be tested to identify its capabilities. More specifically, defined portions of the solid-state storage media can be individual tested to identify their capabilities. As indicated previously, such portions can be as discrete as the individual solid-state storage cells, which can each, individually, store a quantum of data. As also indicated previously, such individual portions can be more broadly defined so as to encompass groups of cells, whole dies, or other like delineable portions of solid-state storage media. For ease of presentation, the descriptions below are directed to the delineation of solid-state storage media based on individual solid-state storage cells. The mechanisms described, however, are equally applicable to differently sized portions of solid-state storage media.

In the exemplary system 200 of FIG. 2, individual solid-state storage cells, such as the exemplary solid-state storage cells 241, 242, 243, 244, 245 and 246 can be tested to identify their capabilities, such as the speed with which data can be written to and read from such solid state storage cells, the anticipated endurance of such solid state storage cells, the retention capabilities of such solid-state storage cells, the relevant voltage thresholds for the storage of data by such solid-state storage cells, and other like capabilities. By way of illustration, the mechanisms described herein focus upon performance and endurance capabilities, although other capabilities can, likewise, be utilized as a basis for delineating and utilizing different groupings of solid-state storage media.

The testing of the exemplary solid-state storage cells 241, 242, 243, 244, 245 and 246 is illustrated in the exemplary system 200 of FIG. 2 as being performed by the firmware 141 of a storage device comprising solid-state storage cells 241, 242, 243, 244, 245 and 246. In other embodiments, such testing can equally be performed by processes executing on a computing device to which such a storage device has been communicationally coupled, or combinations of firmware and processes executing on a computing device.

In the exemplary system 200 of FIG. 2, the testing of a solid-state storage cell, such as the solid-state storage cell 241, by the firmware 141, is illustrated by the arrow 211. In response, results 212 can be obtained by the firmware 141, which can indicate, for example, that the solid-state storage cell 241 has high performance and high endurance. More specifically, the results 212 can provide empirical data representative of high performance and high endurance, though, for purposes of brevity, FIG. 2 only utilizes the categorizations "high", "mid" and "low". By way of illustration of the empirical data that can be provided by the results 212, such results can indicate that the solid-state storage cell 241 can accommodate data written to it at three hundred and fifty megabytes-per-second and can provide data being read from it at five hundred megabytes-per-second. With regards to endurance, the empirical data provided by the results 212 can be extrapolated into endurance indicators based upon known solid-state endurance extrapolation methodologies.

Testing of the solid-state storage cells 242, 243, 244, 245 and 246 can proceed in an equivalent manner. For example, the testing of the solid-state storage cell 242, illustrated by the arrow 213, can provide results 214 that can be indicative of a mid-level performance, such as, for example, results indicating that the solid-state storage cell 242 can accommodate data written to it at two hundred megabytes-per-second and provide data being read from it at four hundred megabytes-per-second. The results 214 can also provide, by way of example, data that can be extrapolated to indicate that the solid-state storage cell 242 will have a high endurance. As another example, the testing of the solid-state storage cells 245 and 246, illustrated by the arrows 221 and 223, respectively, can likewise provide results 222 and 224, respectively, that can also be indicative of a mid-level performance, such as the exemplary mid-level performance quantified by the example provided above with reference to solid-state storage cell 242. The results 222 can further provide data that can be extrapolated to indicate that the solid-state storage cell 245 will have a mid-level endurance, and the results 224 can further provide data that can be extrapolated to indicate that the solid-state storage cell 246 will have low endurance.

As indicated previously, the solid-state storage media that is comprised of the exemplary solid-state storage cells 241, 242, 243, 244, 245 and 246 that are shown in FIG. 2 can be solid-state storage media that can be acquired inexpensively because it has not previously been tested. Consequently, such solid-state storage media can comprise components or portions thereof that do not operate properly, have been improperly formed, or whose capabilities are insufficient. For example, testing of the solid-state storage cell 243, indicated by the arrow 215, can provide results 216 that are indicative of a failure of the solid-state storage cell 243. By way of example, the results 216 can indicate that the solid-state storage cell 243 cannot properly store data for subsequent retrieval, or they can indicate that the solid-state storage cell 243 cannot have data reliably read from it. The testing of the solid-state storage cell 244, indicated by the arrow 217, can provide results 219 that, while not indicative of the failure of the solid-state storage cell 244, can be indicative of characteristics of the solid-state storage cell 244 that are insufficient.

More specifically, while the solid-state storage medium comprising the solid-state storage cells 241, 242, 243, 244, 245 and 246 can be unthresholded, the initialization procedure described can enable some amount of thresholding to be performed as part of that initialization procedure. For example, and as indicated previously, in one embodiment, a threshold performance level can be established such that the solid-state storage media being utilized provides a performance that is at least equivalent to comparable magnetic-based storage media. More specifically, the threshold performance level can be established, in such an embodiment, based upon the speed with which data can be written to the solid-state storage media. As will be recognized by those skilled in the art, solid-state storage media typically enables data to be read from it more quickly then it enables data to be written to it. Consequently, if the threshold performance level is established such that the speed with which data is written to the solid-state storage media is at least equivalent to the speed with which data is written to comparable magnetic-based storage media, then it can be reasonably expected that the speed with which data is read from the solid-state storage media will be greater, and in many cases substantially greater, than the speed with which data is read from comparable magnetic-based storage media.

In such an embodiment, it is expected that such a low (for solid-state storage media) threshold performance level will enable a substantial portion of previously untested and unthresholded solid-state storage media to exceed such a low threshold performance level and, thereby, be utilizable. In turn, because a substantial portion of such solid-state storage media can be utilized, and because, as illustrated above, such unthresholded solid-state storage media can be sold and acquired inexpensively, a solid state-based-storage device operating in accordance with the descriptions provided herein can have a cost that is comparable to comparable magnetic-based storage devices, provide performance that is at least equivalent to those comparable magnetic-based storage devices, but yet can provide greater heat tolerance, greater reliability, less power consumption, and other like benefits.

Turning back to the testing of the solid-state storage cell 244, illustrated by the arrow 217 in the system 200 of FIG. 2, such testing can provide results 219 that can be indicative of a low performance level, and which can provide the basis for an extrapolated endurance that is likewise low. By way of example, the results 219 can reveal that the solid-state storage cell 244 can only accommodate data written to it at fifty megabytes-per-second and can provide data being read from it at one hundred megabytes-per-second. As will be recognized by those skilled in the art, conventional magnetic-based storage devices can often read and write data, at least sequentially, at speeds greater than one hundred megabytes-per-second. Consequently, the results 219 can reveal that the solid-state storage cell 244 has a performance level below that of comparable magnetic-based storage media.

The results 212, 214, 216, 219, 222 and 224 from the testing of solid-state storage media, such as the exemplary solid-state storage cells 241, 242, 243, 244, 245 and 246, respectively, can be utilized to construct or modify a table, such as the exemplary write policy table 250, which can inform the subsequent utilization of the tested solid-state storage media. For example, such a table can identify which portions of the now tested solid-state storage media can be utilized for the storage of data, and which portions are to be avoided, either because such portions failed the above-described testing, or because such portions were tested and found to have capability levels below a threshold. Additionally, such a table can identify the manner in which those portions of the tested solid-state storage media, which have been deemed utilizable, are to be utilized. For example, the table can identify the speed with which data can be written to such portions, the types of data to be preferably stored on such portions, the priority with which such portions are to be utilized, and other like utilization factors.

The exemplary write policy table 250, shown in the system 200 of FIG. 2, illustrates an exemplary categorization and defining of utilization factors relevant to portions of the tested solid-state storage media, namely the specific solid-state storage cells 241, 242, 243, 244, 245 and 246. More specifically, exemplary write policy table 250 illustrates exemplary mechanisms by which portions of tested solid-state storage media can be combined into groupings or "bins" for subsequent utilization, where all of the solid-state storage media in a particular bin can be utilized in a homogenous manner. In one embodiment, such bins can correspond to logical volumes, though, in other embodiments, a single bin can accommodate multiple volumes, or, alternatively, a single volume can span multiple bins. For example, as illustrated by the exemplary write policy table 250, one bin can comprise those storage cells that have been tested and found to have high performance and at least a mid-level amount of extrapolated endurance, such as, for example, the storage cell 241. As another example, another bin can comprise those storage cells that have been tested and found to have a mid-level performance and at least a mid-level amount of extrapolated endurance, such as, for example the storage cells 242 and 245. In the exemplary write policy table 250, a third bin can comprise those storage cells that have been tested and found to have at least a mid-level performance and a low extrapolated endurance, such as, for example, the storage cell 246. As will be described in further detail below, such binning can control how data is written to the solid-state storage media, including the speed with which such data is written to the solid-state storage media and the specific portions of the solid-state storage media to which specific types of data are written.

As also illustrated by the exemplary write policy table 250, specific portions of the solid-state storage media that has been tested can be identified as not operational or not to be used, such as by not being associated with a bin, or by having appropriate values, such as a corresponding write speed, set to zero. For example, the solid-state storage cell 243 that was found to have failed the initialization testing can be identified as being a non-operational portion of the solid-state storage media. Similarly, as another example, the solid-state storage cell 244 that was found to have a performance level below a performance threshold can, similarly, be identified as being nonoperational since such a portion of the solid-state storage media cannot be utilized in the manner desired, namely to provide a performance that is at least equivalent to performance of a corresponding magnetic-based storage device.

In addition to combining various portions of tested solid-state storage media into sections that can be treated homogenously, a write policy table, such as the exemplary write policy table 250, can also define how quickly data can be written to the corresponding solid-state storage media. As will be recognized by those skilled in the art, the speed with which data is written to solid-state storage media can impact the anticipated endurance of such solid-state storage media. For example, if the speed with which data is written to solid-state storage media is cut in half, then, merely from a purely mathematical sense, the anticipated endurance of such solid-state storage media can be doubled, since it can take twice the amount of time to achieve the number of writes of which such solid-state storage media is anticipated to be capable of. Furthermore, reducing the speed with which data is written to solid-state storage media can also reduce the physical stresses on such solid-state storage media, which can, likewise, increase its anticipated endurance.

Another benefit of limiting, or "throttling", the speed with which data can be written to solid-state storage media can be the utilization of solid-state storage media having differing performance attributes. More specifically, the presently described mechanisms enable solid-state storage media having differing performance attributes such as, for example, the exemplary solid-state storage cells 241, 242, 243, 244, 245 and 246, to be utilized in such a manner that only a minimum of such solid-state storage media is deemed unusable. For example, if the exemplary solid-state storage cells 241, 242, 243, 244, 245 and 246 have been tested by a traditional manufacturer of solid-state-based storage devices, it is likely that only the solid-state storage cell 241 would have been found to exceed the sorts of thresholds typically applied by such manufacturers and the entire solid-state storage media comprising the exemplary solid-state storage cells 241, 242, 243, 244, 245 and 246 would have either been discarded, or would have been sold as a solid-state storage media of significantly reduced capacity. In either case, the cost per storage capacity would have been much higher than that provided for by the presently described mechanisms, which can, through write throttling, enable utilization of not only the solid-state storage cell 241, but also the solid-state storage cells 242, 245 and 246. As such, the exemplary write policy table 250 can specify that data being written to the solid-state storage cell 241 can be written at a high rate of speed, while data being written to any one or more of the solid-state storage cells 242, 245 and 246 can be throttled to a lower rate of speed.

In one embodiment, such as that illustrated by the exemplary system 200 of FIG. 2, the write policy table 250 can be built by a write throttling engine 139, as illustrated by the arrow 240. In such an embodiment, the firmware 141, which, as indicated, can have tested the solid-state storage media comprising the exemplary solid-state storage cells 241, 242, 243, 244, 245 and 246, can provide the results 230 obtained from such testing to the write throttling engine 139, which can then, in turn, build the write policy table 250, as illustrated by the arrow 240. As indicated previously, in such an embodiment, the write throttling engine 139 can be part of an operating system or other like software executing on a computing device to which a solid-state based storage device comprising the exemplary solid-state storage cells 241, 242, 243, 244, 245 and 246 can have been communicationally coupled.

In such an embodiment, the write throttling engine 139, or other aspects of the operating system, can control both the above-described initialization testing of the solid-state storage media and the subsequent building or modification of the write policy table 250. More specifically, in such an embodiment, the firmware 141 can expose interfaces that can be accessed by the write throttling engine 139 and can instruct the firmware 141 to perform the above-described initialization testing of the solid-state storage media. The results 230 of such testing can then be returned, through one of those same interfaces, to the write throttling engine 139, and the write throttling engine 139 can utilize those results 230 to build or modify the write policy table 250, as illustrated by the arrow 240.

As indicated previously, as part of such building or modification of the write policy table 250, thresholding can be performed to identify portions of the solid-state storage media, such as the exemplary solid-state storage cell 244, whose performance, or other attributes, are below a threshold level, and which portions should, thereby, not be utilized. Although such thresholding has been described previously as being informed by the performance, and more specifically the write performance, of comparable magnetic-based storage media, such a threshold is merely one embodiment of the presently described mechanisms. In other embodiments, the write throttling engine 139, or other aspects of the operating system, or other processes executing on the computing device to which the solid-state storage media is communicationally coupled, can select more appropriate thresholds. For example, a higher performance threshold can be established such that, for example, from among the exemplary illustrated solid-state storage cells shown in FIG. 2, only the solid-state storage cell 241 can exceed such a higher performance threshold and can be selected for subsequent utilization. In such an example, the write policy table 250 could specify that all of the other exemplary solid-state storage cells shown in FIG. 2, other than the solid-state storage cell 241, can have failed such a thresholding and are not to be utilized. In such an example, however, such a higher performance threshold can result in less of the solid-state storage media being utilizable and, consequently, result in a higher cost per storage capacity. Nevertheless, by enabling processes executing on a computing device, to which a solid-state storage media is communicationally coupled, to select capability thresholds, the mechanisms described herein enable users of such solid-state storage media to determine and enforce their own cost/capability metrics.

In other embodiments, the generation or modification of a write policy table, such as exemplary write policy table 250, can have been performed by the firmware 141 directly, or, alternatively, both the above described testing and the subsequent generation or modification of a write policy table can have been performed by the write throttling engine 139, or other like software executing on a computing device to which the solid-state-based storage device is communicationally coupled.

Figure 3:
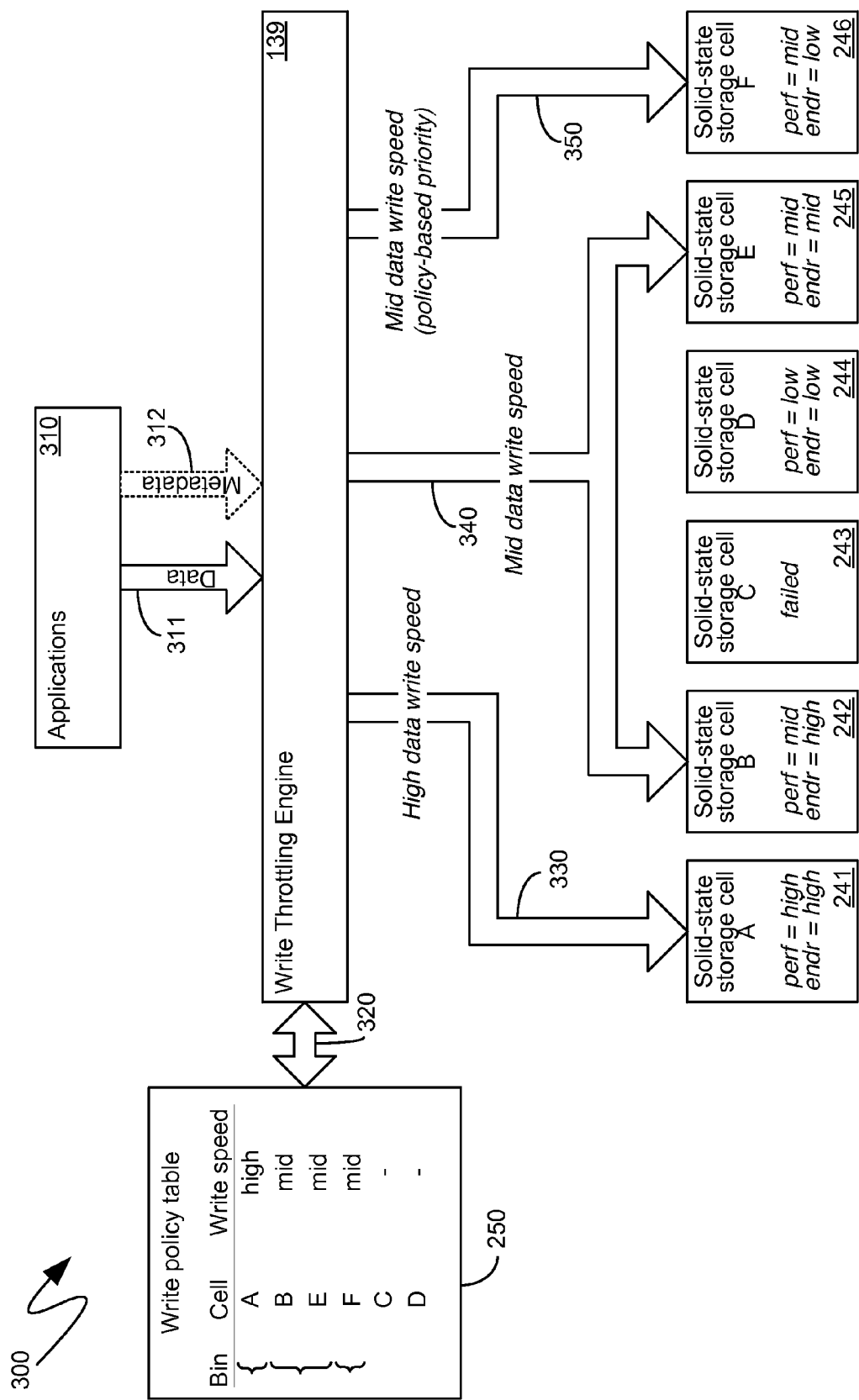
FIG. 3 is a layer block diagram of an exemplary utilization of solid-state storage media informed by empirically collected performance data.

Turning to FIG. 3, system 300 shown therein illustrates an exemplary utilization, such as by the write throttling engine 139, of the write policy table 250 to inform the manner in which the solid-state storage media comprising the solid-state storage cells 241, 242, 243, 244, 245 and 246 is utilized. To provide context for the descriptions below, the applications 310 are illustrated in the system 300 of FIG. 3. The applications 310 are meant to represent one or more application programs, comprising computer-executable instructions executing on a computing device to which solid-state storage media is communicationally coupled, where such application programs seek to store data on the solid-state storage media. Initially, as will be recognized by those skilled in the art, data that the applications 310 seek to store on a storage medium can be provided to an operating system, which can communicate with the appropriate drivers, controllers and other like components to achieve the storage of the data on the storage medium. In one embodiment, such an operating system can comprise a write throttling engine 139 that can receive the data 311 from the applications 310. The write throttling engine 139, with reference 320 to the write policy table 250, can achieve the storage of the data on the storage medium in accordance with the policies being implemented by such a write throttling engine 139 and in accordance with the information contained in the write policy table 250.

For example, if the data 311 is to be stored in the solid-state storage cell 241, the write throttling engine 139 can allow the operating system, drivers, controllers and other like components to write such data 311 to the solid-state storage cell 241 at a high rate of speed, such as is illustrated by the arrow 330 in the exemplary system 300 of FIG. 3. By contrast, if the data 311 is to be stored in one or more of the solid-state storage cells 242 and 245, the write throttling engine 139 can throttle the rate at which the operating system, drivers, controllers and other like components write such data 311. For example, the write throttling engine 139 can only provide the data to the relevant portions of the operating system, drivers, controllers and other like components at a rate of two hundred megabytes-per-second. As another example, the write throttling engine 139 can control and limit how often data is written to a specific portion of the solid-state storage media during a predefined unit of time. For example, the write throttling engine 139 can not allow different data to be written to a solid-state storage cell more than one hundred times per twenty-four hour period, or more than two thousand times per month. In such a manner, if, for example, a solid-state storage cell had an extrapolated endurance of fifty-thousand write-erase cycles, then such a solid-state storage cell could be utilized for at least two years.

The rate at which data written to solid-state storage cells is throttled can be based on the information contained in the write policy table 250, as detailed above. By throttling the rate at which data is written to some portions of the solid-state storage media, such as, for example, the solid-state storage cells 242 and 245, while allowing data written to other portions of the solid-state storage media, such as, for example, the solid-state storage cell 241, the write throttling engine 139 can provide for the utilization of solid state storage devices whose solid-state storage media cannot all accommodate a homogenous write speed. Similarly, by throttling the rate at which data is written to some portions of the solid-state storage media, the write throttling engine 139 can provide for the utilization of solid-state storage devices whose solid-state storage media exhibits non-homogenous endurance-related properties. More specifically, because the write throttling can include limiting the repeated writing of new data to specific cells, as described above, the write throttling engine 139 can provide for the utilization of solid-state storage media that can have cells whose anticipated endurance is meaningfully less than those of other cells. In such a manner, more inexpensive solid-state storage media, such as that detailed above, can be utilized, thereby enabling storage devices to provide many of the benefits of solid-state storage media, such as fast read speeds, heat resistance, low power consumption and mechanical reliability, with costs that are comparable to magnetic-based storage media.

In one embodiment, the write throttling engine 139 can also apply policy regarding which portion of the solid-state storage media is utilized to store specific types of data. For example, if no policy was applied, then the data 311 could be written to any one of the solid-state storage cells in the write policy table 250. Since cells like the solid-state storage cell 241 could accept data more quickly than cells such as the solid-state storage cells 242 and 245, it is likely that a greater volume of the data 311 would be directed to cells like the solid-state storage cell 241. Similarly, if no policy was applied, then the data 311 could be written equally to solid-state storage cells having a high expected endurance, such as, for example, the exemplary solid-state storage cell 241, and solid-state storage cells having below expected endurance, such as, for example, the exemplary solid-state storage cell 246.

One policy that can be applied by the write throttling engine 139, can be a policy that can seek to extend the longevity of as much of the solid-state storage media as possible. Utilizing such a policy, the write throttling engine 139 can direct more data to portions of the solid-state storage media having a higher expected endurance, such as, for example, the exemplary solid-state storage cells 241, 242 and 245, than it can to portions of the solid-state storage media having a lower expected endurance, such as, for example, the exemplary solid-state storage cell 246. Utilizing such a policy, the write throttling engine 139 can increase the duration during which greatest portion of the solid-state storage media remains available as being within its expected endurance. In essence, the write throttling engine 139 can perform a form of wear-leveling, except that, unlike conventional wear leveling, the write throttling engine 139 can take into account different initial expected endurances.

Another policy that can be applied by the write throttling engine 139, can be a policy that seeks to use up more quickly those portions of the solid-state storage media having a low expected endurance. Utilizing such a policy, the write throttling engine 139 can direct more data to portions of the solid-state storage media having lower expected endurance, such as, for example, the exemplary solid-state storage cell 246, than it can to other portions of the solid-state storage media. As a result, the write throttling engine 139 can increase the length of time during which at least portions of the solid-state storage media can be utilized, though such portions can represent decreasing capacity as the portions of such solid-state storage media having lower-than-expected endurances are used up and then marked as sections that are no longer to be used in a write policy table, such as the exemplary write policy table 250.

In one embodiment, the write throttling engine 139 can reference metadata 312 that can, optionally, be provided with the data 311 and can provide information about the data 311. Based upon such metadata 312, the write throttling engine 139 can choose appropriate locations on the solid-state storage media on which to store the data 311. For example, if the metadata 312 indicates that the data 311 is merely temporary data, or scratch data, then the write throttling engine 139 can select to store such data on portions of the solid-state storage media that may be approaching an endurance limit and can, thereby, be more prone to failure. As another example, if the metadata 312 indicates the data 311 needs to be written as quickly as possible, then the write throttling engine 139 can select to store such data on portions of the solid-state storage media that can provide for the highest speed storage of data, such as, for example, the exemplary solid-state storage cell 241. As yet another example, the write throttling engine 139 can take into account various policies, such as those detailed above, in combination with the metadata 312. For example, if the metadata 312 indicates that the data 311 will be frequently overwritten, or changed, then the write throttling engine 139, based on policy, such as those detailed above, can select to store such data 311 on portions of the solid-state storage media having low expected endurance, for example, to use up those portions, or, alternatively, distribute the data across portions of the solid-state storage media in accordance with their expected endurance, for example, to even out the remaining expected endurance of individual cells of the solid-state storage media.

Figure 4:
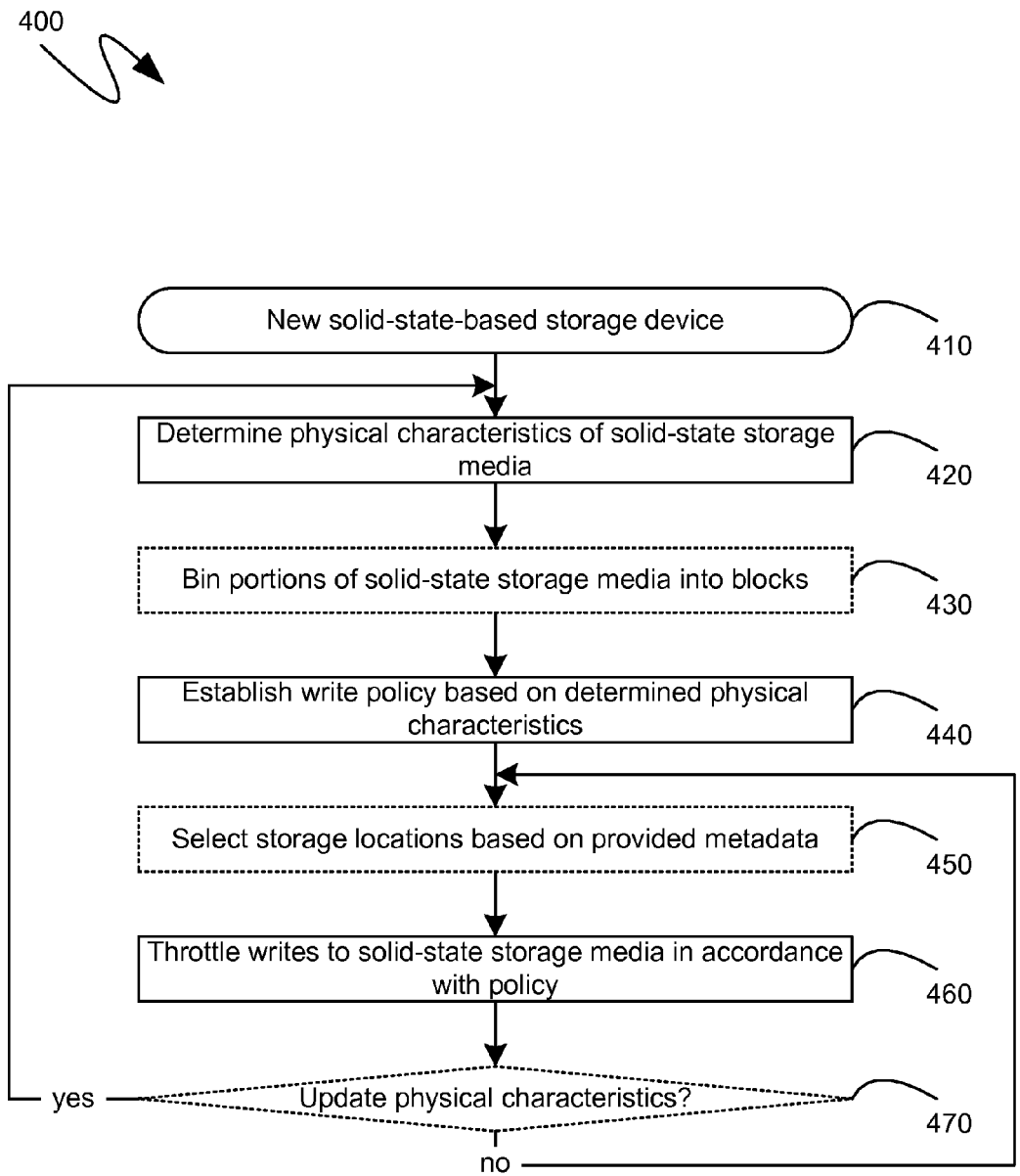
FIG. 4 is a flow diagram of an exemplary utilization of untested solid-state storage media.

Turning to FIG. 4, the flow diagram 400 shown therein illustrates an exemplary series of steps that can be performed to enable utilization of unthresholded solid-state storage media, such as in the manner detailed above. Initially, at step 410, a new solid-state-based storage device can be detected, such as when such a solid-state-based storage device is communicationally coupled with a computing device comprising computer executable instructions performing the steps of the exemplary flow diagram 400. Subsequently, at step 420, defined portions of the solid-state storage media, such as individual solid-state storage cells, groupings thereof, solid-state storage dies, or other like defined portions of the solid-state storage media, can be tested to determine their physical characteristics and their capabilities. For example, in one embodiment, step 420 can be performed by invoking appropriate interfaces of a firmware or other like controlling component that can be co-located with the solid-state storage media on the solid-state-based storage device that was detected at step 410.

The results of the testing, performed at step 420, can be utilized to establish a write policy at step 440. As indicated previously, such a write policy can include write throttling that can limit the rate at which data is written to specific portions of the solid-state storage media based upon the characteristics of such solid-state storage media, determined at step 420. Write throttling can include limiting the number of times new data is written to a specific solid-state storage cell during a predefined period of time, as well as limiting the overall flow of data to defined portions of the solid-state storage media. In one embodiment, as an optional step 430, the solid-state storage media can be binned into blocks or other like collections of solid-state storage media capacity based upon the characteristics that were obtained as part of step 420. Such binning can include the creation of logical volumes that are coincident with such bins, although, in other embodiments, logical volumes can span multiple bins, or a single bin can support multiple logical volumes. Step 430 is illustrated, in FIG. 4, with dashed lines to represent that it can be an optional step.

Subsequent to the establishment of the write policy, at step 440, data to be written to the solid-state storage media can be throttled in accordance with that policy, at step 460. Such throttling can include, as described above, not only the limitation of the flow of data to a specific portion of the solid-state storage media, and the limitation of the quantity of writes performed on specific solid-state storage cells, but can also include selection of where, on the solid-state storage media, data is stored. For example, as indicated previously, portions of the solid-state storage media, which were determined, by the testing at step 420, to have a lower expected endurance, can have fewer data directed to them to prolong utilization of as much of the solid-state storage media as possible or, alternatively, can have a greater amount of data directed to them to use up those sections as quickly as possible, thereby enabling the remaining sections of the solid state storage media to be used for a longer period of time. In one embodiment, at step 450, metadata can be received that can provide information about the data being stored on the solid-state storage media, and the selection of which portions of the solid-state storage media are to receive such data for storage can be informed by such metadata. Step 450 is illustrated with dashed lines in FIG. 4 to illustrate that it is an optional step.

At step 470, an optional determination can be made as to whether to update the information about the solid-state storage media, such as through subsequent testing. In such an embodiment, if a determination is made that the solid-state storage media is to be retested, then processing can return to step 420. Alternatively, processing can return to step 460, and optional step 450, to continue to utilize the existing write policy to store data on the solid-state storage media. As before, step 470 is illustrated with dashed lines in FIG. 4 to indicate that it is an optional step.

As can be seen from the above descriptions, mechanisms for write throttling solid-state storage media in accordance with empirically derived capabilities have been provided. In view of the many possible variations of the subject matter described herein, we claim as our invention all such embodiments as may come within the scope of the following claims and equivalents thereto.

We claim:

1. One or more computer-readable storage media comprising computer-executable instructions for storing data on solid-state storage media, the computer-executable instructions directed to steps comprising:

testing the solid-state storage media to identify capabilities of individual portions of the solid-state storage media;

generating a first set of entries in a write policy table allowing data storage on a first set of individual portions of the solid-state storage media whose capabilities the testing revealed to be greater than a predefined threshold;

including, for each entry of the first set of entries, a write speed that is informed by a capability, of a corresponding portion of the solid-state storage media, to accept data for storage, as revealed by the testing;

generating a second set of entries in the write policy table preventing data storage on a second set of individual portions of the solid-state storage media whose capabilities the testing revealed to be less than the predefined threshold;

receiving the data for storage on the solid-state storage media;

selecting at least some portions of the solid-state storage media, from among the first set of individual portions of the solid-state storage media, on which to store the received data; and throttling a speed with which the received data is written to the selected portions of the solid-state storage media in accordance with the write speed, corresponding to each of the selected portions, obtained from the write policy table.

2. The computer-readable storage media of claim 1, wherein the computer-executable instructions for testing comprise computer-executable instructions for determining a write performance capability of the individual portions of the solid-state storage media.

3. The computer-readable storage media of claim 1, wherein the computer-executable instructions for testing comprise computer-executable instructions for obtaining, from the individual portions of the solid-state storage media, information from which an expected endurance for each of the individual portions of the solid-state storage media can be estimated.

4. The computer-readable storage media of claim 3, wherein the computer-executable instructions for including the write speed comprise computer-executable instructions for including a maximum quantity of writes per unit time for each entry of the first set of entries.

5. The computer-readable storage media of claim 1, wherein the predefined threshold is equivalent to the capabilities of magnetic storage media.

6. The computer-readable storage media of claim 1, wherein the computer-executable instructions for selecting the at least some portions of the solid-state storage media on which to store the received data comprise computer-executable instructions for selecting the at least some portions of the solid-state storage media based upon an expected endurance of the selected portions of the solid-state storage media so as to decrease utilization of those portions of the solid-state storage media having lower expected endurance and so as to increase utilization of those portions of the solid-state storage media having higher expected endurance.

7. The computer-readable storage media of claim 1, wherein the computer-executable instructions for selecting the at least some portions of the solid-state storage media on which to store the received data comprise computer-executable instructions for selecting the at least some portions of the solid-state storage media based upon an expected endurance of the selected portions of the solid-state storage media so as to increase utilization of those portions of the solid-state storage media having lower expected endurance and so as to decrease utilization of those portions of the solid-state storage media having higher expected endurance.

8. The computer-readable storage media of claim 1, comprising further computer-executable instructions for obtaining metadata about the received data; and wherein the computer-executable instructions for selecting the at least some portions of the solid-state storage media on which to store the received data comprise computer-executable instructions for selecting the at least some portions of the solid-state storage media based upon the obtained metadata.

9. The computer-readable storage media of claim 1, wherein the individual portions of the solid-state storage media each comprise a single solid-state storage cell.

10. A method for provisioning a computing device with inexpensive solid-state-based storage, the method comprising the steps of:
obtaining unthresholded solid-state storage media;
testing the obtained solid-state storage media to identify capabilities of individual portions of the solid-state storage media;
generating a first set of entries in a write policy table allowing data storage on a first set of individual portions of the solid-state storage media whose capabilities the testing revealed to be greater than a predefined threshold;
including, for each entry of the first set of entries, a write speed that is informed by a capability, of a corresponding portion of the solid-state storage media, to accept data for storage, as revealed by the testing;
generating a second set of entries in the write policy table preventing data storage on a second set of individual portions of the solid-state storage media whose capabilities the testing revealed to be less than the predefined threshold;
receiving data for storage on the solid-state storage media;
selecting at least some portions of the solid-state storage media, from among the first set of individual portions of the solid-state storage media, on which to store the received data; and
throttling a speed with which the received data is written to the selected portions of the solid-state storage media in accordance with the write speed, corresponding to each of the selected portions, obtained from the write policy table.

11. The method of claim 1, wherein the selecting the at least some portions of the solid-state storage media on which to store the received data comprises selecting the at least some portions of the solid-state storage media based upon an expected endurance of the selected portions of the solid-state storage media so as to decrease utilization of those portions of the solid-state storage media having lower expected endurance and so as to increase utilization of those portions of the solid-state storage media having higher expected endurance.

12. The method of claim 1, wherein the selecting the at least some portions of the solid-state storage media on which to store the received data comprises selecting the at least some portions of the solid-state storage media based upon an expected endurance of the selected portions of the solid-state storage media so as to increase utilization of those portions of the solid-state storage media having lower expected endurance and so as to decrease utilization of those portions of the solid-state storage media having higher expected endurance.

13. The method of claim 10, wherein the testing comprises determining a write performance capability of the individual portions of the solid-state storage media.

14. The method of claim 10, wherein the testing comprises obtaining, from the individual portions of the solid-state storage media, information from which an expected endurance for each of the individual portions of the solid-state storage media can be estimated.

15. The method of claim 14, wherein the including the write speed comprises including a maximum quantity of writes per unit time for each entry of the first set of entries.

16. A storage device comprising:
unthresholded solid-state storage media; and
firmware performing steps comprising:
testing the solid-state storage media to identify capabilities of individual portions of the solid-state storage media;
generating a first set of entries in a write policy table allowing data storage on a first set of individual portions of the solid-state storage media whose capabilities the testing revealed to be greater than a threshold;
including, for each entry of the first set of entries, a write speed that is informed by a capability, of a corresponding portion of the solid-state storage media, to accept data for storage, as revealed by the testing;
generating a second set of entries in the write policy table preventing data storage on a second set of individual portions of the solid-state storage media whose capabilities the testing revealed to be less than the threshold;
receiving data for storage on the solid-state storage media;

selecting at least some portions of the solid-state storage media, from among the first set of individual portions of the solid-state storage media, on which to store the received data; and throttling a speed with which the received data is written to the selected portions of the solid-state storage media in accordance with the write speed, corresponding to each of the selected portions, obtained from the write policy table.

17. The storage device of claim 16, wherein the threshold is obtained from a computing device to which the storage device is communicationally coupled.

18. The storage device of claim 16, wherein the testing is initiated by processes executing on a computing device to which the storage device is communicationally coupled though an interface exposed by the firmware.

19. The storage device of claim 17, wherein the generating the first set of entries and the second set of entries comprises providing results of the testing to processes executing on a computing device to which the storage device is communicationally coupled though an interface exposed by the firmware.

20. The storage device of claim 16, wherein the individual portions of the solid-state storage media each comprise a single solid-state storage cell.

* * * * *